(12) United States Patent
Jung et al.

(10) Patent No.: US 11,069,881 B2
(45) Date of Patent: Jul. 20, 2021

(54) FLEXIBLE ORGANIC LIGHT-EMITTING DIODE DISPLAY

(71) Applicant: LG Display Co., Ltd., Seoul (KR)

(72) Inventors: Jinhyun Jung, Paju-si (KR); Seokwon Ji, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/205,507

(22) Filed: Nov. 30, 2018

(65) Prior Publication Data
US 2019/0173057 A1 Jun. 6, 2019

(30) Foreign Application Priority Data
Dec. 4, 2017 (KR) .......................... 10-2017-0165207

(51) Int. Cl.
*H01L 51/52* (2006.01)
*H01L 51/00* (2006.01)
*H01L 27/32* (2006.01)

(52) U.S. Cl.
CPC ...... *H01L 51/5281* (2013.01); *H01L 51/0097* (2013.01); *H01L 27/3213* (2013.01); *H01L 27/3262* (2013.01); *H01L 2251/5338* (2013.01)

(58) Field of Classification Search
CPC ............. H01L 51/5281; H01L 51/0097; H01L 27/3213; H01L 2251/5338; H01L 27/3262; H01L 27/326; H01L 27/3244; Y02E 10/549; G09F 9/301
See application file for complete search history.

(56) References Cited

U.S. PATENT DOCUMENTS

| 9,202,855 | B1 | 12/2015 | Jo et al. | |
| 2012/0280894 | A1* | 11/2012 | Park | H01L 27/326 345/77 |
| 2014/0183472 | A1* | 7/2014 | Kim | H01L 27/3258 257/40 |
| 2015/0261029 | A1* | 9/2015 | Park | G02F 1/13394 349/106 |

FOREIGN PATENT DOCUMENTS

| KR | 10-2016-0021342 A | 2/2016 |
| KR | 10-2016-0032306 A | 3/2016 |

* cited by examiner

*Primary Examiner* — Su C Kim
(74) *Attorney, Agent, or Firm* — Fenwick & West LLP

(57) ABSTRACT

Provided is a flexible organic light-emitting diode display. The flexible organic light-emitting diode display includes a flexible substrate, a unit pixel and an anti-reflection layer. The unit pixel is disposed on the flexible substrate and includes an emission area and a non-emission area. The anti-reflection layer is disposed to correspond to the emission area except the non-emission area.

11 Claims, 6 Drawing Sheets

FLEXIBLE ORGANIC LIGHT-EMITTING DIODE DISPLAY

CROSS-REFERENCE TO RELATED APPLICATIONS

This application claims the benefit of Republic of Korea Patent Application No. 10-2017-0165207 filed on Dec. 4, 2017, which is incorporated by reference in its entirety.

BACKGROUND

Field of the Invention

The present invention relates to a flexible organic light-emitting diode display. Particularly, the present invention relates to an organic light-emitting diode display having a structure for preventing damage due to repeated bending operation.

Related Art

Nowadays, various flat panel display devices are developed for overcoming many drawbacks of the cathode ray tube such as heavy weight and bulk volume. Such flat panel display devices include the liquid crystal display (LCD), the field emission display (FED), the plasma display panel (PDP) and the electro-luminescence device (EL).

Electro-luminescence devices are classified into an inorganic Electro-luminescence device and an organic light-emitting diode display according to the material of an emission layer and are spontaneously emitting devices having a high response speed, emission efficiency and luminance and a wide viewing angle. Particularly, the organic light-emitting diode display which have high energy efficiency and small leakage current and easily represent gradation through current control is increasingly required.

In particular, the organic light-emitting diode display includes components formed of organic materials and thus is "flexible" which is one of characteristics of organic materials, that is, can be freely bend. By using such advantage, the organic light-emitting diode display is developed as a display which can be worn on a curved surface of the body of a user, such as a wearable display. Furthermore, the organic light-emitting diode display is also developed as a display having a curved shape or a rollable display in the case of a large-screen display.

Such flexible displays have various applications. However, since various elements having fine patterns are integrated in high density in displays, elements may be easily damaged when bending operation is repeated. Furthermore, films or coating layers are formed to improve the display function. If bending stress is frequently applied to such films or coating layers, they may be easily stripped off or damaged.

Accordingly, there is a demand for structural development and improvement for maintaining the display function and preventing generation of damage even when flexible displays are repeatedly bent.

SUMMARY OF THE INVENTION

An object of the present invention devised in view of the aforementioned circumstances is to provide a flexible organic light-emitting diode display having a structure for preventing damage due to repeated bending operation. Another object of the present invention is to provide a flexible transparent display which is used to observe the situation of the background such as transparent glass when not used, provides the display function when used and has a structure for preventing damage due to repeated bending operation. Yet another object of the present invention is to provide a flexible organic light-emitting diode display having a structure for preventing the display function deterioration due to reflected light and a structure for preventing damage due to repeated bending operation.

To accomplish the objects, a flexible organic light-emitting diode display according to the present invention includes a flexible substrate, a unit pixel and an anti-reflection layer. The unit pixel is disposed on the flexible substrate and includes an emission area and a non-emission area. The anti-reflection layer is disposed corresponding to the emission area except the non-emission area.

For example, the emission area includes an organic light-emitting diode in which an anode, an organic emission layer and a cathode are sequentially laminated.

For example, the non-emission area includes thin film transistors for driving the organic light-emitting diode disposed in the emission area.

For example, the non-emission area includes a transparent area.

For example, the emission area includes thin film transistors for driving the organic light-emitting diode, disposed under the organic light-emitting diode.

For example, the unit pixel includes four sub-pixels expressing any one of red, green blue and white. The four sub-pixels area arranged along a first axis of the flexible substrate. The emission area is disposed on the upper side of the unit pixel. The non-emission area is disposed on the lower side of the unit pixel. The anti-reflection layer has a strip shape along the first axis corresponding to the emission area.

For example, the unit pixel includes four sub-pixels expressing any one of red, green, blue and white colors and arranged in a 2×2 matrix, and two transparent areas arranged in a 2×1 matrix on any one of the left side and the right side of the sub-pixels. An area in which the four sub-pixels are disposed is defined as the emission area. The transparent areas are defined as the non-emission area. The anti-reflection layer has a strip shape along the axis on which the emission area is arranged.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DESCRIPTION OF EXEMPLARY EMBODIMENTS

The advantages, features and methods for accomplishing the same of the present invention will become more apparent through the following detailed description with respect to the accompanying drawings. However, the present invention is not limited by embodiments described blow and may be implemented in various different forms, and the embodiments are provided so that this disclosure will be thorough and complete, and will fully convey the scope of the invention to those skilled in the art. The present invention is defined by the scope of the claims.

Shapes, sizes, ratios, angles, numbers, etc. shown in the figures to describe embodiments of the present invention are exemplary and thus are not limited to particulars shown in the figures. Like numbers refer to like elements throughout the specification.

In describing the present invention, if a detailed description of known techniques associated with the present invention would unnecessarily obscure the gist of the present invention, detailed description thereof will be omitted. It will be further understood that when the terms "include", "have" and "comprise" are used in this specification, other parts may be added unless "~ only" is used. An element described in the singular form is intended to include a plurality of elements unless context clearly indicates otherwise.

In interpretation of a component, the component is interpreted as including an error range unless otherwise explicitly described. It will be understood that, when an element is referred to as being "on" or "under" another element, it can be "directly" on or under another element or can be "indirectly" formed such that an intervening element is also present.

In the following description of the embodiments, "first" and "second" are used to describe various components, but such components are not limited by these terms. The terms are used to discriminate one component from another component. Accordingly, a first component mentioned in the following description may be a second component within the technical spirit of the present invention.

Features of embodiments of the present invention can be coupled or combined partially or overall and technically interoperated in various manners, and the embodiments may be implemented independently or associatively.

Hereinafter, preferred embodiments of the present invention will be described in detail with reference to the attached drawings. The following embodiments focus on organic light-emitting diode displays including organic emission materials as electro-luminescence displays. However, the technical scope of the present invention is not limited to the organic light-emitting diode displays and is also applicable to inorganic light-emitting diode displays including inorganic emission materials.

First Embodiment

Figure 1:
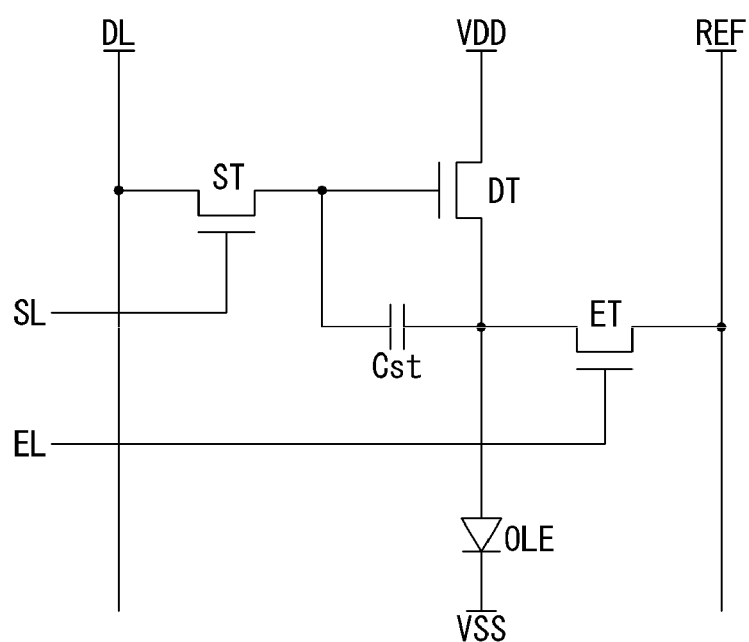
FIG. 1 is an equivalent circuit diagram showing a structure of a pixel in a flexible organic light-emitting diode display according to a first embodiment of the present invention.
Figure 2:
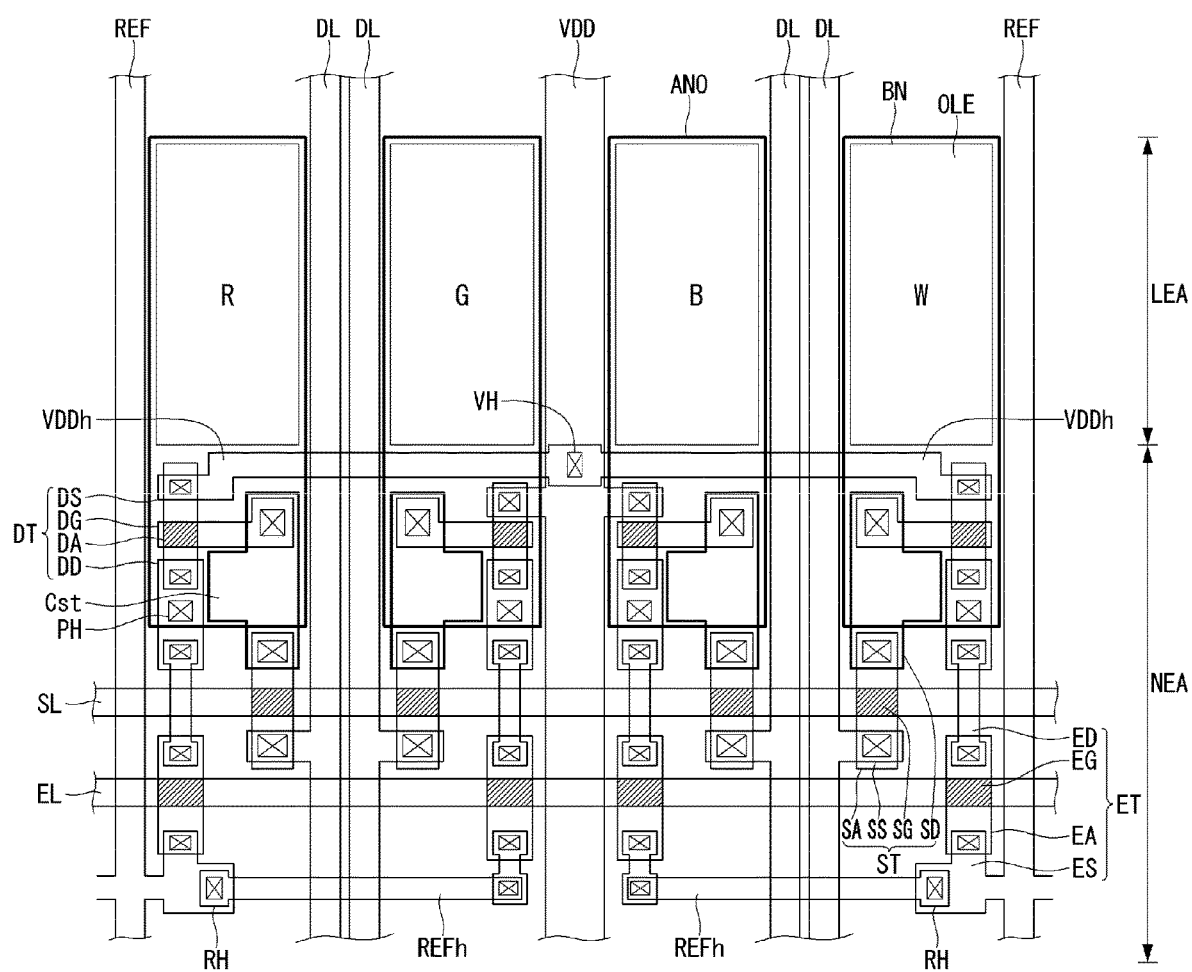
FIG. 2 is a plan view showing a structure of the flexible organic light-emitting diode display according to the first embodiment of the present invention.

A first embodiment of the present invention will be described with reference to FIGS. 1 to 3. FIG. 1 is an exemplary equivalent circuit diagram showing a structure of a pixel in a flexible organic light-emitting diode display including a compensation circuit according to the first embodiment of the present invention. FIG. 2 is a plan view showing a structure of the flexible organic light-emitting diode display according to the first embodiment of the present invention.

Referring to FIG. 1, one pixel of the flexible organic light-emitting diode display according to the first embodiment of the present invention includes a switching thin film transistor ST, a driving thin film transistor DT, an auxiliary capacitor Cst, a compensation circuit and an organic light-emitting diode OLE. The compensation circuit may be configured in various manners. Here, a case in which the compensation circuit includes a sensing thin film transistor ET, a sensing line REF and a sensing control line EL is described.

The switching thin film transistor ST performs switching operation such that a data signal supplied through a data line DL is stored as a data voltage in the auxiliary capacitor Cst in response to a scan signal supplied through a scan line SL. The driving thin film transistor DT operates such that driving current flows between a power line VDD and a ground line VSS according to the data voltage stored in the auxiliary capacitor Cst. The organic light-emitting diode OLE emits light according to the driving current generated by the driving thin film transistor DT.

The sensing thin film transistor ET is a circuit added to the pixel in order to compensate for the threshold voltage of the driving thin film transistor DT. The sensing thin film transistor ET is connected between the drain electrode of the driving thin film transistor DT and the anode (or sensing node) of the organic light-emitting diode OLE. The sensing thin film transistor ET is enabled through the sensing control line EL. The sensing thin film transistor ET operates to provide an initialization voltage (or sensing voltage) supplied through the sensing line REF to the sensing node to sense (detect) the voltage or current of the sensing node.

The source electrode of the switching thin film transistor ST is connected to the data line DL and the drain electrode thereof is connected to the gate electrode of the driving thin film transistor DT. The source electrode of the driving thin film transistor DT is connected to the power line VDD and the drain electrode thereof is connected to the anode of the organic light-emitting diode OLE. The auxiliary capacitor Cst includes a first electrode connected to the gate electrode of the driving thin film transistor DT (or the drain electrode of the switching thin film transistor ST) and a second electrode connected to the anode of the organic light-emitting diode OLE.

The anode of the organic light-emitting diode OLE is connected to the drain electrode of the driving thin film transistor DT and the cathode thereof is connected to the ground line VSS. The gate electrode of the sensing transistor ET is connected to the sensing control line EL, the source electrode thereof is connected to the sensing line REF, and the drain electrode thereof is connected to the anode of the organic light-emitting diode OLE which is a sensing node.

Operation time of the sensing thin film transistor ET may be similar/identical to or different from that of the switching thin film transistor ST according to compensation algorithm. For example, the switching thin film transistor ST is connected to the scan line SL through the gate electrode thereof, whereas the sensing thin film transistor ET may be connected to the sensing control line EL through the gate electrode thereof, as shown in FIG. 1. Alternatively, the gate electrode of the switching thin film transistor ST and the gate electrode of the sensing thin film transistor ET may be commonly connected to the scan line SL.

In addition, compensation targets according to sensing results may be digital data signals, analog data signals or gamma signals. The compensation circuit for generating a compensation signal (or compensation voltage) on the basis of sensing results may be provided in a data driver or a timing controller, or may be realized as a separate circuit.

Although the pixel having a 3T1C (3 transistors and 1 capacitor) structure including the switching thin film transistor ST, the driving thin film transistor DT, the auxiliary capacitor Cst, the organic light-emitting diode OLE and the sensing thin film transistor ET has been described in FIG. 1, the pixel may be configured in 3T2C, 4T2C, 5T1C and 6T2C structures when a compensation circuit is added.

The pixel structure of the flexible organic light-emitting diode display according to the first embodiment of the present invention will be described with reference to FIG. 2. In the flexible organic light-emitting diode display according to the first embodiment of the present invention, a pixel region is defined by a sensing line REF, a data line DL and a driving current line VDD extended in the vertical direction (column direction), and a horizontal sensing line REFh, a horizontal current line VDDh, a scan line SL and a sensing control line EL extended in the horizontal direction (or row direction). Specifically, one pixel region is defined as a plane space between two neighboring horizontal sensing lines REFh and between a driving current line VDD and a data line DL (or between a sensing line REF and a data line DL).

The horizontal sensing line REFh is connected to the sensing line REF extended in the vertical direction through a sensing contact hole RH. The horizontal current line VDDh is connected to the driving current line VDD extended in the vertical direction through a current contact hole VH.

In the flexible organic light-emitting diode display according to the first embodiment of the present invention, four red (R), green (G), blue (B) and white (W) sub-pixels consecutively arranged in the row direction constitute a unit pixel. The unit pixel composed of four sub-pixels is repeatedly disposed. The unit pixel is defined by two neighboring horizontal sensing lines REFh and two neighboring sensing lines REF.

Four sub-pixels are arranged horizontally symmetrically on the basis of the driving current line VDD in such a manner that two sub-pixels are arranged on the left side of the driving current line VDD and two sub-pixels are arranged on the right side of the driving current line VDD. The horizontal sensing line REFh is branched off from or connected to the sensing lines REF disposed on the left and right sides thereof and extended to two left sub-pixel regions and two right sub-pixel regions.

In a pixel region, a region between the horizontal driving current line VDDh and the horizontal sensing line REFh is defined as a non-emission area in which thin film transistors and an auxiliary capacitor are disposed. The anode of the organic light-emitting diode OLE is disposed between the corresponding horizontal driving current line VDDh and a horizontal sensing line REFh of a neighboring pixel. The anode ANO is defined as an emission area by a bank BN, and the organic light-emitting diode OLE is formed in the emission area LEA.

The switching thin film transistor ST includes a switching source electrode SS connected to the data line DL, a switching gate electrode SG which is part of the scan line SL, a switching semiconductor layer SA, and a switching drain electrode SD. A region in which the switching gate electrode SG is superposed on the switching semiconductor layer SA is a channel region (shaded part). The switching semiconductor layer SA is disposed across the scan line SL to form the switching thin film transistor ST.

The sensing thin film transistor ET includes a sensing source electrode ES connected to the horizontal sensing line REFh, a sensing gate electrode EG which is part of the sensing control line EL, a sensing semiconductor layer EA, and a sensing drain electrode ED. A region in which the sensing gate electrode EG is superposed on the sensing semiconductor layer EA is a channel region (shaded part). The sensing semiconductor layer EA is disposed across the sensing control line EL to form the sensing thin film transistor ET.

The driving thin film transistor DT includes a driving source electrode DS which is branched off from the driving current line VDD or is part of the horizontal current line VDDh, a driving gate electrode DG connected to the switching drain electrode SD, a driving semiconductor layer DA, and a driving drain electrode DD. A region in which the driving gate electrode DG is superposed on the driving semiconductor layer DA is a channel region (shaded part). The driving semiconductor layer DA extends from the driving source electrode DS to the scan line SL across the driving gate electrode DG. The driving drain electrode DD is connected to one side of the driving semiconductor layer DA and the sensing drain electrode ED.

The auxiliary capacitor Cst includes the first electrode and the second electrode. The first electrode is formed from an extended part of the switching drain electrode SD. The second electrode is formed as part of the driving drain electrode DD or the anode ANO. Here, a case in which part of the anode ANO is formed as the second electrode overlapping with the first electrode is illustrated for convenience.

The driving thin film transistor DT and the auxiliary capacitor Cst are disposed between the horizontal current line VDDh and the scan line SL. The switching thin film transistor ST and the sensing thin film transistor ET are disposed between the scan line SL and the horizontal sensing line REFh. That is, driving elements are arranged between the horizontal current line VDDh and the horizontal sensing line REFh and this area is defined as a non-emission area NEA. The anode ANO extends from the emission area LEA to the non-emission area NEA.

The anode ANO of the organic light-emitting diode OLE is connected to the driving drain electrode DD through the pixel contact hole PH. The anode ANO is partially exposed by the bank BN. An organic emission layer and the cathode are sequentially laminated on the anode ANO and the bank BN to form the organic light-emitting diode OLE. The organic light-emitting diode OLE has a size corresponding to the emission area LEA.

Referring to FIG. 2, the flexible organic light-emitting diode display has a structure in which the emission area LEA defined by an opening of the bank BN does not overlap the thin film transistors ST, DT and ET. This represents the structure of a bottom emission type flexible organic light-emitting diode display. In the case of top emission type, the area of the anode ANO overlapping with the thin film transistors ST and DT and the auxiliary capacitor Cst may also be included in the opening of the bank BN. Furthermore, the anode ANO may be extended to a point before the horizontal sensing line REFh and the sensing thin film transistor ET may also be included in the opening of the bank BN.

Hereinafter, the entire structure of the flexible organic light-emitting diode display according to the first embodiment of the present invention will be described with reference to FIG. 3. FIG. 3 is a plan view showing the entire structure of the flexible organic light-emitting diode display according to the first embodiment of the present invention.

The flexible organic light-emitting diode display according to the first embodiment of the present invention includes a display panel DP and an anti-reflection layer AR. The anti-reflection layer AR is attached to the front side of the display panel DP over the display area. Particularly, the anti-reflection layer is selectively attached to the emission area LEA of the display panel DP and is not provided on the non-emission area NEA.

For example, the display panel DP for the flexible display has a rectangular plate-shaped structure in which the X-axis side (or horizontal side) is longer than the Y-axis side (or vertical side) in the XY plane. Particularly, the display panel includes display elements formed on a substrate made of a thin plastic film and thus is easily bent.

The display panel DP includes a plurality of sub-pixels SP arranged in a matrix. One sub-pixel SP includes the emission area LEA and the non-emission area NEA. Here, a case in which the sub-pixel SP has a rectangular shape having a longer side in the Y-axis direction (or vertical direction) is illustrated. Further, a case in which the emission area LEA is defined to correspond to the sub-pixels SP and the non-emission area NEA is defined to correspond to areas other than the sub-pixels SP is illustrated.

One sub-pixel SP is assigned one of red (R), green (G), blue (B) and white (W) colors. Four sub-pixels R, G, B and W constitute a single unit pixel UP. Accordingly, the emission area LEA on the first row and the non-emission area NEA on the second low in the horizontal direction are alternatively arranged in the entire area of the display panel.

The front side of the display panel DP displays video information viewed by a user. When the user views the display panel DP, the user may not clearly recognize the video information if ambient light is reflected from the front side of the display panel DP. To prevent such reflection of external light, it is desirable to attach the anti-reflection layer AR to the front side of the display panel DP.

Particularly, the present invention is characterized in that the anti-reflection layer AR is disposed to correspond to the emission areas LEA and is not provided on the non-emission areas NEA. The anti-reflection layer AR is formed of a film member and may have an optical adhesive layer coated on one side thereof. The side of the anti-reflection layer AR on which the optical adhesive layer is coated is attached to the front side of the display panel DP to attach the anti-reflection layer AR to the display panel DP.

The entire area of the anti-reflection layer AR may have a size corresponding to the display area of the display panel DP. Specifically, it is desirable that the anti-reflection layer AR be slightly larger than the display area and slightly smaller than the area of the display panel DP. The anti-reflection layer AR in the form of a film or sheet corresponding to the area of the display panel DP may have a structure in which strips corresponding to the emission areas LEA in the X-axis direction and formed by selectively removing the regions corresponding to the non-emission areas NEA are arranged in the Y-axis direction at a regular interval. Here, the regular interval between the strips corresponds to the width of the non-emission area NEA.

The display panel DP and the anti-reflection layer AR may have different bending stresses. When the display panel and the anti-reflection layer attached to each other having different bending stresses are repeatedly bent, they may be separated from each other or any one may be damaged due to stress difference.

Figure 3:
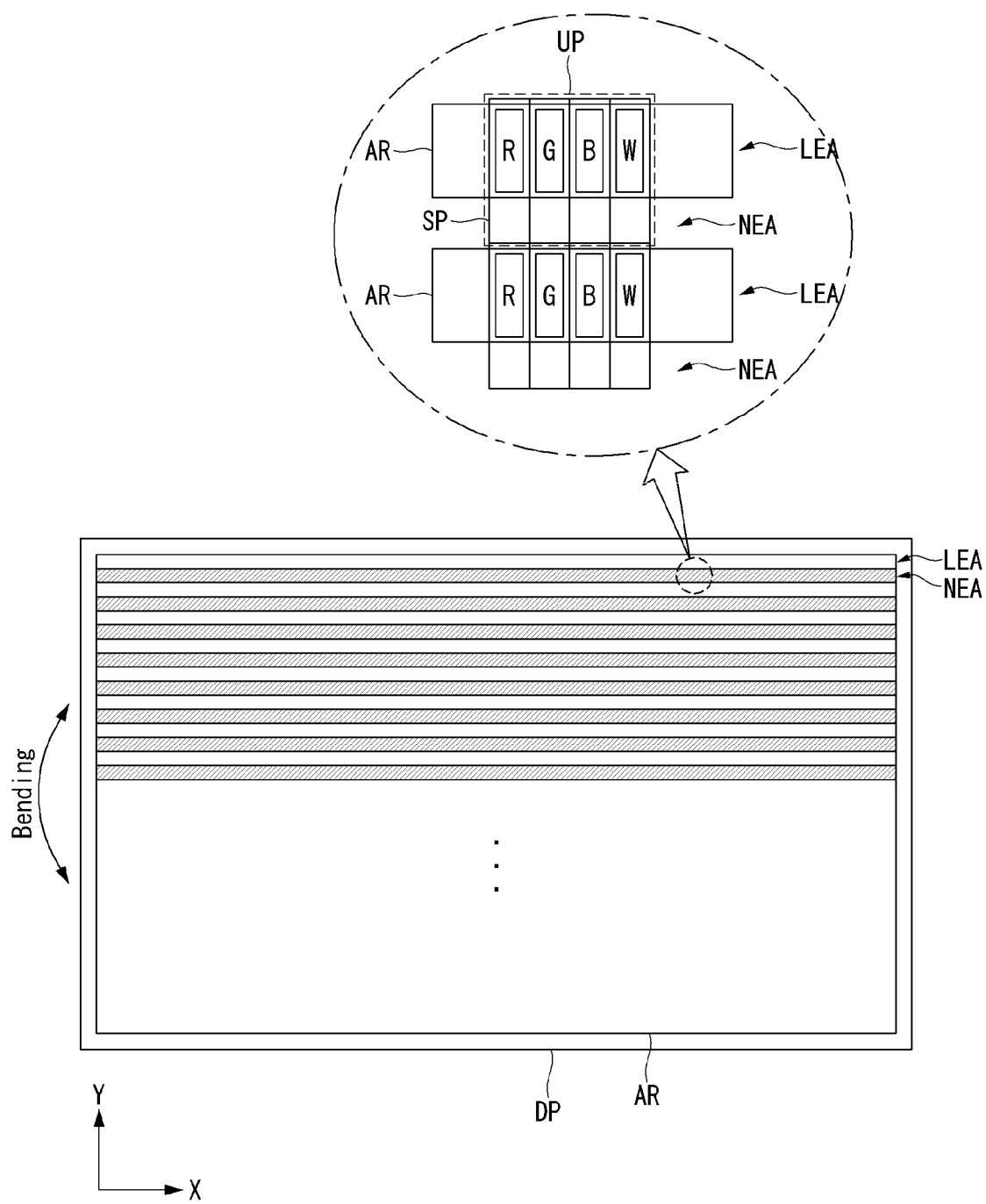
FIG. 3 is a plan view showing the overall structure of the flexible organic light-emitting diode display according to the first embodiment of the present invention.

However, in the structure according to the first embodiment of the present invention shown in FIG. 3, the ant-reflection layer AR is attached only to selected regions at a regular interval instead of the overall surface of the display panel DP. Particularly, the anti-reflection layer AR has a striped form along the X axis. Accordingly, the anti-reflection layer AR is not separated from the display panel DP, and the display panel DP or the anti-reflection layer AR is not damaged due to stress difference when the display panel DP is repeatedly bent in the Y-axis direction.

On the other hand, when the display panel DP is repeatedly bent in the X-axis direction, the possibility that a problem due to stress difference is generated may be higher compared to the case in which the display panel DP is repeatedly bent in the Y-axis direction. Accordingly, it is desirable that the anti-reflection layer AR have a striped form in a direction perpendicular to the direction in which the display panel DP is frequently bent or bending operation is repeated.

A case in which the sub-pixel SP has a shape having a longer side in the vertical direction has been described in the first embodiment. However, the sub-pixel SP may have a shape having a longer side in the horizontal direction. In this case, an emission area EA and a non-emission area NEA are arranged in a striped form in the Y-axis direction in the display panel DP. Accordingly, the anti-reflection layer AR may be formed in a striped form along the Y-axis direction. In this case, it is desirable to set a bending axis to the X axis.

Second Embodiment

Figure 4:
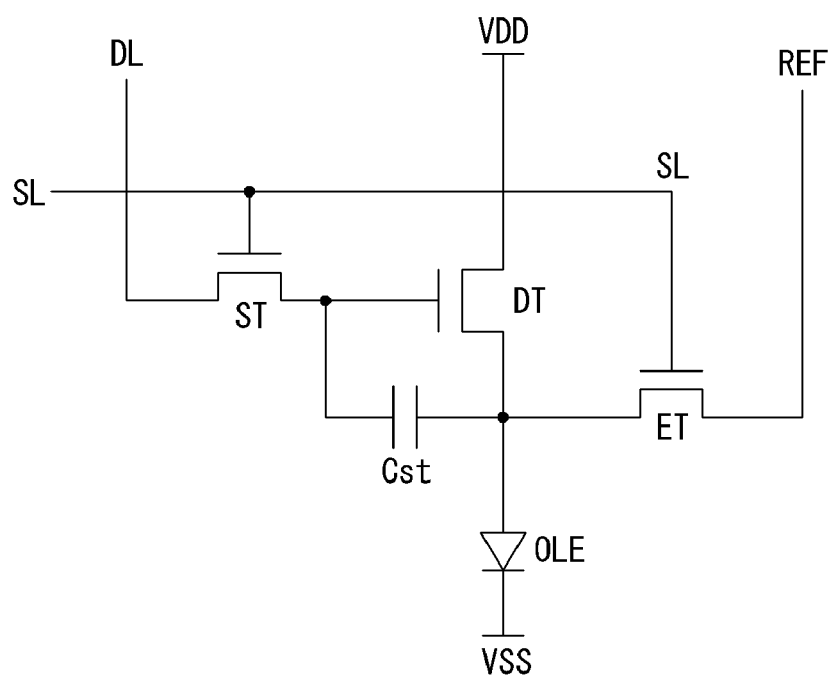
FIG. 4 is an equivalent circuit diagram showing a structure of a pixel in a transparent flexible organic light-emitting diode display according to a second embodiment of the present invention.
Figure 5:
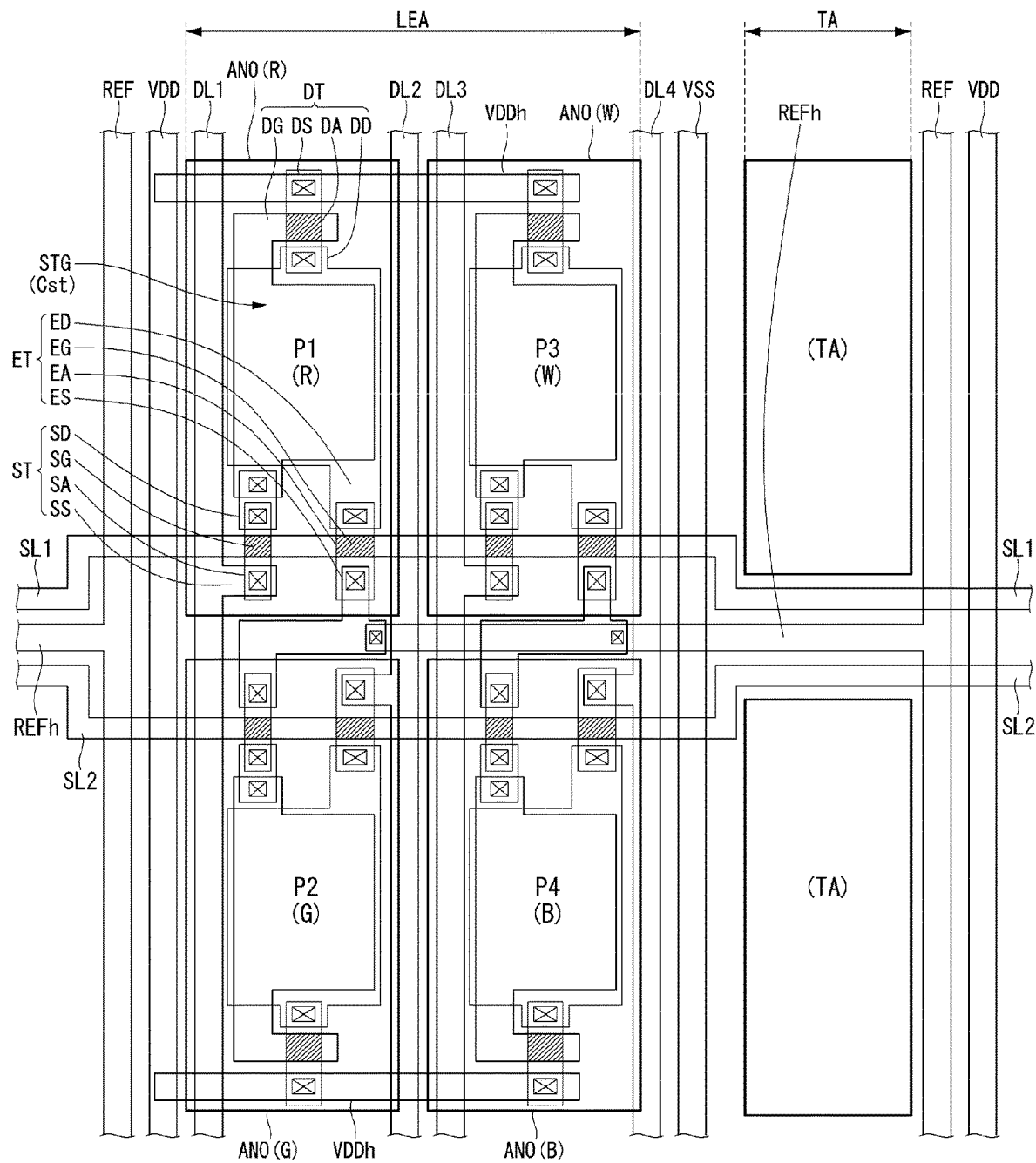
FIG. 5 is a plan view showing a structure of the transparent flexible organic light-emitting diode display according to the second embodiment of the present invention.

A second embodiment of the present invention will be described with reference to FIGS. 4 to 6. FIG. 4 is an exemplary equivalent circuit diagram showing a structure of a pixel in a transparent flexible organic light-emitting diode display according to the second embodiment of the present invention. FIG. 5 is a plan view showing a structure of the transparent flexible organic light-emitting diode display according to the second embodiment of the present invention.

Referring to FIG. 4, one pixel of the transparent flexible organic light-emitting diode display according to the second embodiment of the present invention includes a switching thin film transistor ST, a driving thin film transistor DT, an auxiliary capacitor Cst and an organic light-emitting diode OLE. The compensation circuit may be configured in various manners. Here, a case in which the compensation circuit includes a sensing thin film transistor ET and a sensing line REF is described.

The switching thin film transistor ST performs switching operation such that a data signal supplied through a data line DL is stored as a data voltage in the auxiliary capacitor Cst in response to a scan signal supplied through a scan line SL. The driving thin film transistor DT operates such that driving current flows between a power line VDD and a ground line VSS according to the data voltage stored in the auxiliary capacitor Cst. The organic light-emitting diode OLE emits light according to the driving current generated by the driving thin film transistor DT.

The sensing thin film transistor ET is a circuit added to the pixel in order to compensate for the threshold voltage of the driving thin film transistor DT. The sensing thin film transistor ET is connected between the drain electrode of the driving thin film transistor DT and the anode (or sensing node) of the organic light-emitting diode OLE. The sensing thin film transistor ET operates to provide an initialization voltage (or sensing voltage) supplied through the sensing line REF to the sensing node or to sense (detect) the voltage or current of the sensing node.

The resource electrode of the switching thin film transistor ST is connected to the data line DL and the drain electrode thereof is connected to the gate electrode of the driving thin film transistor DT. The source electrode of the driving thin film transistor DT is connected to the power line VDD and the drain electrode thereof is connected to the anode of the organic light-emitting diode OLE. The auxiliary capacitor Cst includes a first electrode connected to the gate electrode of the driving thin film transistor DT and a second electrode connected to the anode of the organic light-emitting diode OLE.

The anode of the organic light-emitting diode OLE is connected to the drain electrode of the driving thin film transistor DT and the cathode thereof is connected to the ground line VSS. The source electrode of the sensing transistor ET is connected to the sensing line REF and the drain electrode thereof is connected to the anode of the organic light-emitting diode OLE which is the sensing node.

Operation time of the sensing thin film transistor ET may be similar/identical to or different from that of the switching thin film transistor ST according to compensation algorithm. For example, the gate electrode of the switching thin film transistor ST and the gate electrode of the sensing thin film transistor ET may be commonly connected to the scan line SL, as shown in FIG. 5. Alternatively, the gate electrode of the switching thin film transistor ST may be connected to the scan line SL whereas the gate electrode of the sensing thin film transistor ET may be connected to another scan line (not shown).

Although the pixel having a 3T1C (3 transistors and 1 capacitor) structure including the switching thin film transistor ST, the driving thin film transistor DT, the auxiliary capacitor Cst, the organic light-emitting diode OLE and the sensing thin film transistor ET has been described in FIG. 4, the pixel may be configured in 3T2C, 4T2C, 5T1C and 6T2C structures when a compensation circuit is added.

The pixel structure of the transparent flexible organic light-emitting diode display according to the second embodiment of the present invention will be described with reference to FIG. 5. The transparent flexible organic light-emitting diode display according to the second embodiment of the present invention includes a driving current line VDD, first to fourth data lines DL1 to DL4, a reference voltage line Vss and a sensing line REF extended in the vertical direction on a film type substrate. In addition, the transparent flexible organic light-emitting diode display includes a first scan line SL1, a second scan line SL2 and a horizontal sensing line REFh extended in the horizontal direction on the substrate.

The first to fourth data lines DL1 to DL4 are arranged between the driving current line VDD and the reference voltage line Vss. The sensing line REF is arranged between the reference voltage line Vss and the driving current line VDD.

An emission area LEA is disposed between the driving current line VDD and the reference voltage line Vss. Further, a transparent area TA is arranged between the reference voltage line Vss and the sensing line REF. The reference voltage line Vss may not be provided as necessary. In this case, the emission area LEA may be disposed between the driving current line VDD and the data lines DL1 to DL4. The transparent area TA may be disposed between the data lines DL1 to DL4 and the sensing line REF.

The first scan line SL1 and the scan line SL2 are arranged across the driving current line VDD, the data lines DL1 to DL4 and the sensing line REF. The first scan line SL1 and the second scan line SL2 are arranged adjacent to each other. The horizontal sensing line REFh is disposed between the first scan line SL1 and the second scan line SL2.

The transparent flexible organic light-emitting diode display according to the second embodiment of the present invention includes unit pixel regions each of which includes four sub-pixels and two transparent areas TA. The unit pixel region is disposed between two neighboring sensing lines REF. The driving current line VDD, the first to fourth data lines DL1 to DL4 and the reference voltage line Vss are arranged between two neighboring sensing lines REF.

A first pixel region P1 and a second pixel region P2 are disposed between the first data line DL1 and the second data line DL2. A third pixel region P3 and a fourth pixel region P4 are disposed between the third data line DL3 and the fourth data line DL4. The first pixel region P1 is defined by the first data line DL1, the second data line DL2, the first scan line SL1 and a horizontal driving line VDDh. The second pixel region P2 is defined by the first data line DL1, the second data line DL2, the second scan line SL2 and the horizontal driving line VDDh. The third pixel region P3 is defined by the third data line DL3, the fourth data line DL4, the first scan line SL1 and the horizontal driving line VDDh. The fourth pixel region P4 is defined by the third data line DL3, the fourth data line DL4, the second scan line SL2 and the horizontal driving line VDDh.

A red pixel R may be disposed in the first pixel region P1, a green pixel G may be disposed in the second pixel region P2, a white pixel W may be disposed in the third pixel region P3 and a blue pixel B may be disposed in the fourth pixel region P4. Here, a case in which red, white, green and blues sub-pixels constitute a single unit pixel is described. However, the present invention is not limited thereto and a unit pixel may be configured using various color arrangements.

Thin film transistors ST, DT and ET, an auxiliary capacitor STG and an organic light-emitting diode OLE are disposed in each of the pixel regions P1 to P4. Particularly, the transparent organic light-emitting diode display according to the second embodiment is a top emission type display in which the thin film transistors ST, DT and ET and the auxiliary capacitor STG are disposed under the organic light-emitting diode OLE. Some lines may overlap the organic light-emitting diode OLE in order to maximize the area of the emission area LEA.

Here, the first pixel region P1 is described as a representative pixel region. The switching thin film transistor ST includes a switching source electrode SS connected to the first data line DL1, a switching gate electrode SG which is part of the first scan line SL1, a switching semiconductor layer SA, and a switching drain electrode SD. A region in which the switching gate electrode SG is superposed on the switching semiconductor layer SA is a channel region (shaded part). The switching semiconductor layer SA is disposed across the first scan line SL1 to form the switching thin film transistor ST.

The sensing thin film transistor ET includes a sensing source electrode ES connected to the horizontal sensing line REFh, a sensing gate electrode EG which is part of the first sensing line SL1, a sensing semiconductor layer EA, and a sensing drain electrode ED. A region in which the sensing gate electrode EG is superposed on the sensing semiconductor layer EA is a channel region (shaded part). The sensing semiconductor layer EA is disposed across the first sensing line SL1 to form the sensing thin film transistor ET.

The driving thin film transistor DT includes a driving source electrode DS which is part of the horizontal current line VDDh branched off from the driving current line VDD, a driving gate electrode DG connected to the switching drain electrode SD, a driving semiconductor layer DA, and a driving drain electrode DD. A region in which the driving gate electrode DG is superposed on the driving semiconductor layer DA is a channel region (hatched part). The driving semiconductor layer DA extends from the horizontal current line VDDh to the scan line SL across the driving gate electrode DG. The driving drain electrode DD is connected to one side of the driving semiconductor layer DA and the sensing drain electrode ED.

The auxiliary capacitor Cst includes the first electrode and the second electrode. The first electrode is formed from an extended part of the switching drain electrode SD. The second electrode is formed from an extended part of the driving gate electrode DG. The first pixel region P1 in which the thin film transistors ST, DT and ET and the auxiliary capacitor Cst are disposed is arranged between the first scan line SL1 and the horizontal current line VDDh.

The anode ANO is disposed in the first pixel region P1. Although not shown, a planarization layer is formed on the surface of the substrate on which the thin film transistors ST, DT and ET and the auxiliary capacitor Cst are formed and the anode ANO is formed on the planarization layer. The anode ANO is connected to the drain electrode DD of the driving thin film transistor DT. The anode ANO has a rectangular shape which covers almost overall area of the first pixel region P1.

A bank BN for defining the emission area LEA is formed on the anode ANO. An opening formed in the bank BN defines the emission area LEA in the anode ANO. An organic emission layer is formed on the emission area LEA. A cathode is formed on the organic emission layer to cover the entire surface of the substrate. The organic light-emitting diode OLE formed by laminating the anode ANO, the organic emission layer and the cathode is disposed in the emission area LEA.

FIG. 5 shows a case in which the emission area LEA of a sub-pixel has an area almost identical to the area of the sub-pixel. Although a non-emission area is provided between sub-pixels, this is not shown. Accordingly, the emission area LEA is illustrated as an area including all of the four sub-pixels.

In the transparent flexible organic light-emitting diode display according to the second embodiment, almost whole area of the pixel region is defined as the emission area LEA. The transparent area TA is disposed separately from the emission area LEA corresponding to the pixel region. Specifically, two transparent areas TA are arranged on one side of a unit pixel region composed of four sub-pixels regions.

Hereinafter, the entire structure of the transparent flexible organic light-emitting diode display according to the second embodiment of the present invention will be described with reference to FIG. 6. FIG. 6 is a plan view showing the entire structure of the transparent flexible organic light-emitting diode display according to the second embodiment of the present invention.

The transparent flexible organic light-emitting diode display according to the second embodiment of the present invention includes a display panel DP and an anti-reflection layer AR. The anti-reflection layer AR is attached to the front side of the display panel DP over the display area. Particularly, the anti-reflection layer is selectively attached to the emission area LEA of the display panel DP and is not provided on the non-emission area NEA. Here, the non-emission area NEA is an area in which elements for the display function are not arranged and the background is viewed through the non-emission area NEA. Accordingly, the none-emission area NEA according to the second embodiment includes the transparent area TA.

Particularly, the organic light-emitting diode OLE and the thin film transistors are arranged in the emission area LEA, whereas lines and the transparent area TA are arranged in the non-emission area NEA. It is desirable to provide only transparent materials in the transparent area TA in order to improve a degree to which light transmits (i.e., transmittance). For example, the cathode CAT and insulating layers or the cathode CAT, the organic emission layer OLE and insulating layers may be disposed in the transparent area TA.

For example, the display panel DP for the flexible display has a rectangular plate-shaped structure in which the X-axis side (or horizontal side) is longer than the Y-axis side (or vertical side) in the XY plane. Particularly, the display panel includes display elements formed on a substrate made of a thin plastic film and thus is easily bent.

The display panel DP includes a plurality of sub-pixels SP arranged in a matrix. One sub-pixel SP includes the emission area LEA and the non-emission area NEA. Here, a case in which the sub-pixel SP has a rectangular shape having a longer side in the Y-axis direction (or vertical direction) is illustrated. The non-emission area NEA includes the transparent area TA.

One sub-pixel SP is assigned one of red (R), green (G), blue (B) and white (W) colors. Four sub-pixels R, B and W and two transparent areas TA constitute a single unit pixel. In addition, the emission area LEA is defined on the left side of the unit pixel and the transparent areas TA are defined on the right side of the unit pixel.

Accordingly, the emission area LEA on the first column and the non-emission area NEA on the second column in the vertical direction are alternatively arranged in the entire area of the display panel.

The front side of the display panel DP displays video information viewed by a user. When the user views the display panel DP, the user may not clearly recognize the video information if ambient light is reflected from the front side of the display panel DP. To prevent such reflection of external light, it is desirable to attach the anti-reflection layer AR to the front side of the display panel DP.

Particularly, the present invention is characterized in that the anti-reflection layer AR is disposed to correspond to the emission areas LEA and is not provided on the non-emission areas NEA. The anti-reflection layer AR is formed of a film member and may have an optical adhesive layer coated on one side thereof. The side of the anti-reflection layer AR on which the optical adhesive layer is coated is attached to the front side of the display panel DP to attach the anti-reflection layer AR to the display panel DP.

The entire area of the anti-reflection layer AR may have a size corresponding to the display area of the display panel DP. Specifically, it is desirable that the anti-reflection layer AR be slightly larger than the display area and slightly smaller than the area of the display panel DP. The anti-reflection layer AR in the form of a film or sheet corresponding to the area of the display panel DP may have a structure in which strips corresponding to the emission areas LEA in the Y-axis direction and formed by selectively removing the regions corresponding to the non-emission areas NEA are arranged in the X-axis direction at a regular interval. Here, the regular interval between the strips corresponds to the width of the non-emission area NEA.

The display panel DP and the anti-reflection layer AR may have different bending stresses. When the display panel and the anti-reflection layer attached to each other having different bending stresses are repeatedly bent, they may be separated from each other or any one may be damaged due to stress difference.

Figure 6:
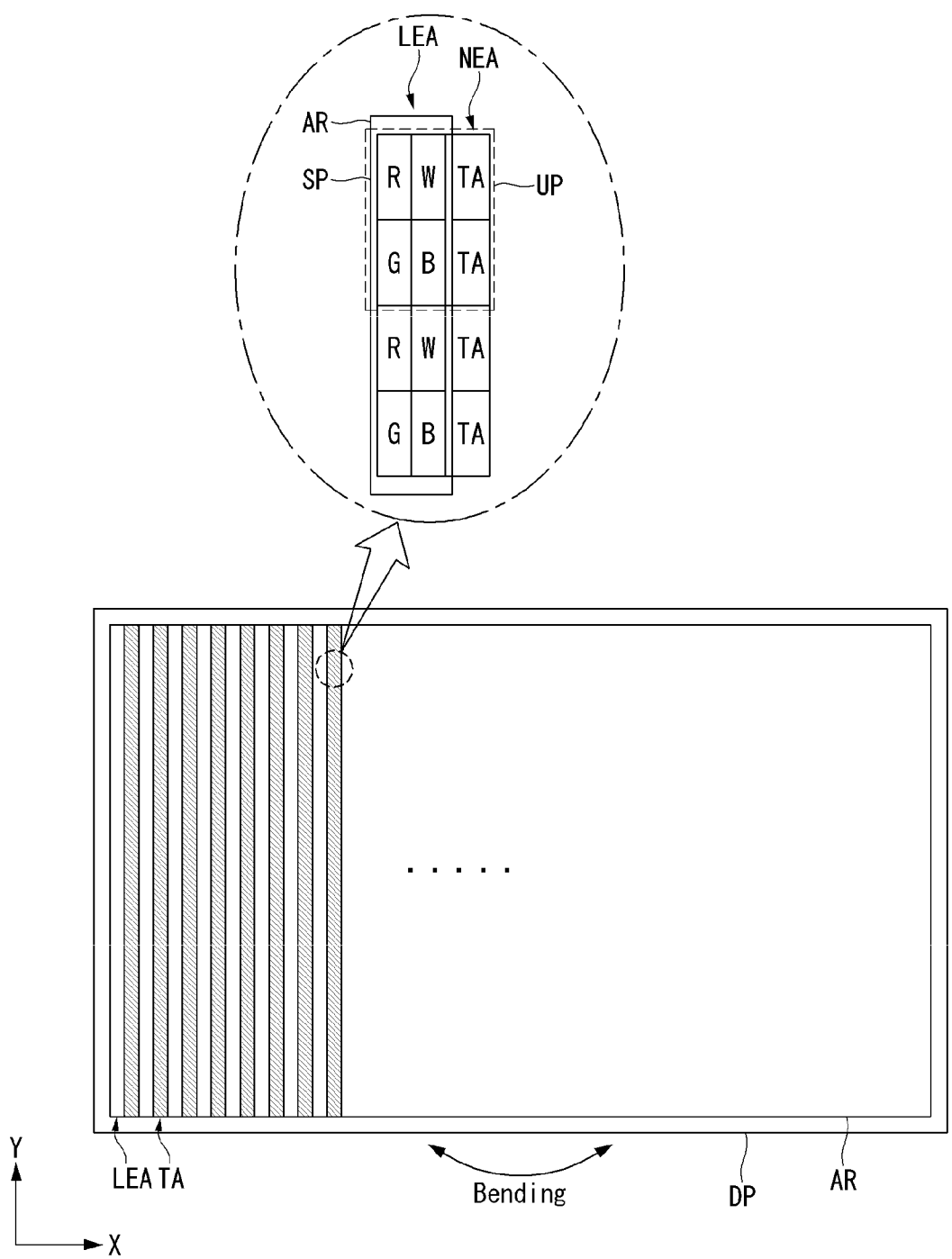
FIG. 6 is a plan view showing the overall structure of the transparent flexible organic light-emitting diode display according to the second embodiment of the present invention.

However, in the structure according to the second embodiment of the present invention shown in FIG. 6, the ant-reflection layer AR is attached only to selected regions at a regular interval instead of the overall surface of the display panel DP. Particularly, the anti-reflection layer AR has a striped form along the Y axis. Accordingly, the anti-reflection layer AR is not separated from the display panel DP or the display panel DP or the anti-reflection layer AR is not damaged due to stress difference when the display panel DP is repeatedly bent in the X-axis direction.

On the other hand, when the display panel DP is repeatedly bent in the Y-axis direction, the possibility that a problem due to stress difference is generated may be higher compared to the case in which the display panel DP is repeatedly bent in the X-axis direction. Accordingly, it is desirable that the anti-reflection layer AR have a striped form in a direction perpendicular to the direction in which the display panel DP is frequently bent or bending operation is repeated.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

The flexible organic light-emitting diode display according to the present invention prevents distortion of display information delivery due to reflection of external light through the anti-reflection layer attached to the front side of the flexible display panel. In the flexible organic light-emitting diode display according to the present invention, the anti-reflection layer is selectively attached only to the emission area and thus separation or damage of the anti-reflection layer does not occur even when the display is repeatedly bent. When the flexible organic light-emitting diode display according to the present invention is applied to a transparent display device to be developed as a transparent flexible display, display function deterioration due to luminous reflection does not occur and damage is not generated even with bending operation.

What is claimed is:

1. A flexible organic light-emitting diode display comprising:
 a display panel with a display area and a non-display area, the display panel comprising:
  a flexible substrate configured to be bended in a second direction, and
  a plurality of unit pixels disposed on the flexible substrate arranged in a first direction, wherein each of the plurality of unit pixels includes an emission area in the display area of the display panel and a non-emission area in the display area of the display panel; and
 an anti-reflection layer disposed on a front side of the display panel,
 wherein the anti-reflection layer covers areas of the display panel corresponding to the emission area of each of the plurality of unit pixels and exposes an area of the display panel corresponding to the non-emission area of each of the plurality of unit pixels, and
 wherein the anti-reflection layer includes a plurality of stripes disposed in the first direction perpendicular to the second direction which is a bending direction and the anti-reflection layer is not disposed on the non-emission area of each of the plurality of unit pixels and is not disposed on portions of the display area of the display panel that are between pairs of the non-emission areas of the plurality of unit pixels along the first direction.

2. The flexible organic light-emitting diode display of claim 1, wherein each of the plurality of unit pixels includes an organic light-emitting diode disposed in the emission area thereof, which includes an anode, an organic emission layer and a cathode.

3. The flexible organic light-emitting diode display of claim 2, wherein the non-emission area includes thin film transistors for driving the organic light-emitting diode.

4. The flexible organic light-emitting diode display of claim 1, wherein the non-emission area includes a transparent area.

5. The flexible organic light-emitting diode display of claim 2, wherein the emission area includes thin film transistors for driving the organic light-emitting diode, disposed under the organic light-emitting diode.

6. The flexible organic light-emitting diode display of claim 1, wherein in the second direction perpendicular to the first direction, the emission area of each of the plurality of unit pixel is located at one side thereof, and the non-emission area of each of the plurality of unit pixel is disposed at another side thereof.

7. The flexible organic light-emitting diode display of claim 6, wherein the first direction is a horizontal direction and the second direction is vertical direction, or the first direction is a vertical direction and the second direction is a horizontal direction.

8. The flexible organic light-emitting diode display of claim 6, wherein each of the plurality of unit pixels includes four sub-pixels located in a line in the first direction.

9. The flexible organic light-emitting diode display of claim 8, wherein the four sub-pixels are arranged in the first direction.

10. The flexible organic light-emitting diode display of claim 8, wherein the four sub-pixels are arranged in a 2×2 matrix.

11. The flexible organic light-emitting diode display of claim 1, wherein each of the plurality of unit pixels includes four sub-pixels expressing red, green, blue and white.

* * * * *